(12) United States Patent
Vollrath et al.

(10) Patent No.: US 7,376,026 B2
(45) Date of Patent: May 20, 2008

(54) INTEGRATED SEMICONDUCTOR MEMORY HAVING SENSE AMPLIFIERS SELECTIVELY ACTIVATED AT DIFFERENT TIMING

(75) Inventors: Joerg Vollrath, Olching (DE); Marcin Gnat, Mering (DE)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 11/364,365

(22) Filed: Mar. 1, 2006

(65) Prior Publication Data

US 2006/0198223 A1   Sep. 7, 2006

(30) Foreign Application Priority Data

Mar. 1, 2005  (DE)  ................. 10 2005 009 360

(51) Int. Cl.
*G11C 29/00*  (2006.01)
*G11C 7/00*   (2006.01)
(52) U.S. Cl. .................. 365/201; 365/194; 365/207; 365/208; 365/230.04
(58) Field of Classification Search ........... 365/189.01, 365/191, 194, 201, 207, 208, 230.04, 230.08
See application file for complete search history.

(56) References Cited

U.S. PATENT DOCUMENTS

| | | | |
|---|---|---|---|
| 5,455,796 A | 10/1995 | Inui et al. | |
| 5,856,982 A | 1/1999 | So et al. | |
| 6,259,641 B1 * | 7/2001 | Manyoki et al. | 365/205 |
| 6,396,754 B1 * | 5/2002 | Lee et al. | 365/201 |
| 6,480,435 B2 * | 11/2002 | Nakamura et al. | 365/207 |

OTHER PUBLICATIONS

Al-Ars Z, et al., "Influence of Bit Line Twisting on the Faulty Behavior of DRAMs", Records of the 2004 International Workshop on Memory Technology, Design and Testing (MTDT'04) 1087-4852/04, 2004, IEEE.

* cited by examiner

*Primary Examiner*—VanThu Nguyen
(74) *Attorney, Agent, or Firm*—Edell, Shapiro & Finnan, LLC (57) ABSTRACT

An integrated semiconductor memory includes a memory cell array in which first sense amplifiers are arranged on a right-hand side of the memory cell array and second sense amplifiers are arranged on a left-hand side of the memory cell array. Due to "post-sense coupling" effects upon activation of the sense amplifiers in conjunction with capacitive coupling effects between bit lines, potential changes occur on adjacent bit lines. The integrated semiconductor memory makes it possible to simulate parasitic coupling effects between adjacent bit lines in a functional test in which the first and second sense amplifiers can be activated in temporarily delayed fashion. As a result, the test severity can be improved and test time can be saved.

12 Claims, 5 Drawing Sheets

INTEGRATED SEMICONDUCTOR MEMORY HAVING SENSE AMPLIFIERS SELECTIVELY ACTIVATED AT DIFFERENT TIMING

CROSS REFERENCE TO RELATED APPLICATIONS

This application claims priority under 35 U.S.C. §119 to German Application No. DE 102005009360.4 filed on Mar. 1, 2005, and titled "Integrated Semiconductor Memory Having Activatable Sense Amplifiers," the entire contents of which are hereby incorporated by reference.

FIELD OF THE INVENTION

The present invention relates to an integrated semiconductor memory having activatable sense amplifiers arranged on first and second sides within a memory cell array.

BACKGROUND

Figure 5:
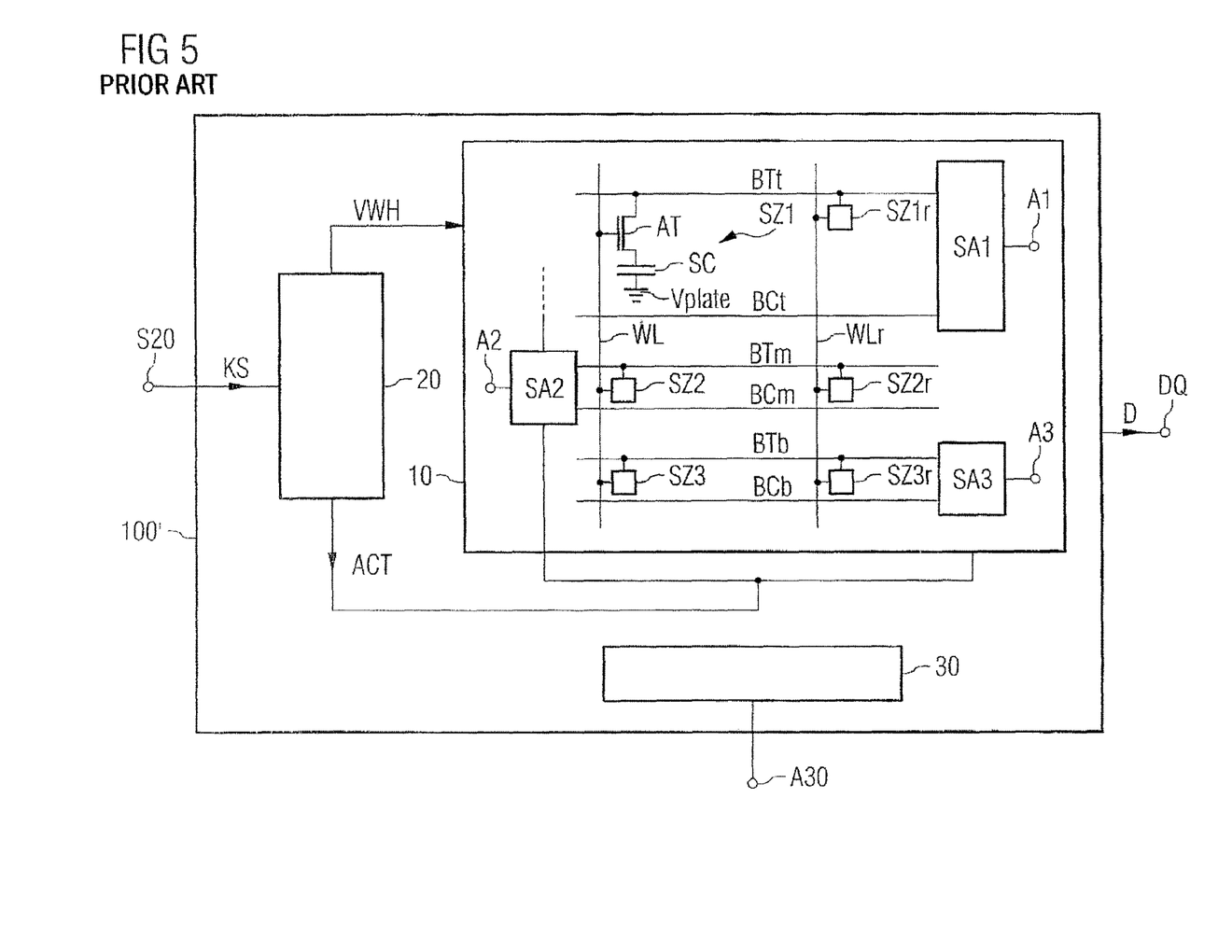
FIG. 5 shows an integrated semiconductor memory with simultaneous activation of the sense amplifiers according to the prior art.

FIG. 5 shows an integrated semiconductor memory 100', which is formed, for example, as a DRAM (Dynamic Random Access Memory) semiconductor memory. The integrated semiconductor memory comprises a memory cell array 10 in which memory cells are arranged in matrix form along word lines and bit lines. In the example of FIG. 5, the memory cell array comprises a word line WL, to which memory cells SZ1, SZ2, and SZ3 are connected. The cells formed as DRAM memory cells comprise a selection transistor AT and a storage capacitor SC. One capacitor plate of the storage capacitor is connected to a true bit line BTt via the selection transistor AT. The other capacitor plate is connected to a terminal for application of a plate voltage Vplate. The plate voltage Vplate may be formed as a ground potential, by way of example.

A complement bit line BCt exists besides the true bit line BTt. The true bit line BTt and complement bit line BCt represent a bit line pair which is connected to a sense amplifier SA1 on a right-hand side of the memory cell array. During the read-out of the memory cell SZ1, the sense amplifier SA1 generates at an output terminal A1, in accordance with the memory state stored in the memory cell SZ1, a datum D, which is fed to a data terminal DQ.

Besides the sense amplifier SA1, a further sense amplifier SA3 exists on the right-hand side of the memory cell array. The sense amplifier SA3 is connected to a bit line pair that comprises a true bit line BTb and a complement bit line BCb. A memory cell SZ3 is connected to the true bit line BTb, and is likewise connected to the word line WL for activation. During the read-out of the memory cell SZ3, in accordance with the memory state of the memory cell SZ3, the sense amplifier SA3 generates at its output terminal A3 a datum which is fed to the data terminal DQ.

Arranged between the upper bit line pair BTt/BCt and the lower bit line pair BTb/BCb is a further bit line pair. This bit line pair comprises a true bit line BTm and a complement bit line BCm. Both bit lines are connected to a further sense amplifier SA2 arranged on the left-hand side of the memory cell array 10. A memory cell SZ2 is connected to the true bit line BTm and is likewise connected to the common word line WL for activation. During the read-out of the memory cell SZ2, the sense amplifier SA2 generates at an output terminal A2, in accordance with the memory state of the memory cell SZ2, a datum, which is fed to the data terminal DQ.

In addition to the word line WL, a further word line WLr is arranged within the memory cell array 10, the further word line being formed as a redundant word line with respect to the word line WL. A memory cell SZ1r is connected to the redundant word line WLr and its memory state is evaluated by the sense amplifier SA1 during read-out. Furthermore, a redundant memory cell SZ2r is connected to the redundant word line WLr and its memory state is evaluated by the sense amplifier SA2. A memory state of a further redundant memory cell SZ3r, which is likewise connected to the redundant word line WLr, is evaluated by the sense amplifier SA3.

In addition to the sense amplifiers SA1 and SA3, further sense amplifiers with their associated bit line pairs are arranged on the right-hand side of the memory cell array. Situated between the bit line pairs which are connected to sense amplifiers on the right-hand side of the memory cell array are further bit line pairs connected to further sense amplifiers on the left-hand side of the memory cell array in an alternating manner.

Prior to a read access, all the bit lines of the memory cell array 10 are charged to a common precharge voltage VEQ. The precharge voltage VEQ lies between a high voltage potential VBH and a low voltage potential VBL.

A read access to the memory cell SZ1 is described below with reference to FIGS. 5 and 6. For the read-out of the memory cell SZ1, an address of the memory cell SZ1 is applied to an address terminal A30 and is read into an address register 30. The actual read access to the memory cell SZ1 is controlled by a control circuit 20. For this purpose, the control circuit 20 is driven by a command signal KS at a control terminal S20. In response to the read command KS, the control circuit 20 drives the word line WL for activating the memory cell SZ1 with a high level of a word line voltage VWH. The selection transistor AT of the memory cell SZ1 is thereby controlled into the on state, so that the storage capacitor of the memory cell SZ1 is conductively connected to the bit line BTt. Since all the remaining memory cells along the word line WL are also driven by the high level of the word line voltage, the memory cells SZ2 and SZ3 are also activated by virtue of the selection transistors AT of the memory cells likewise being controlled into the on state.

Figure 6:
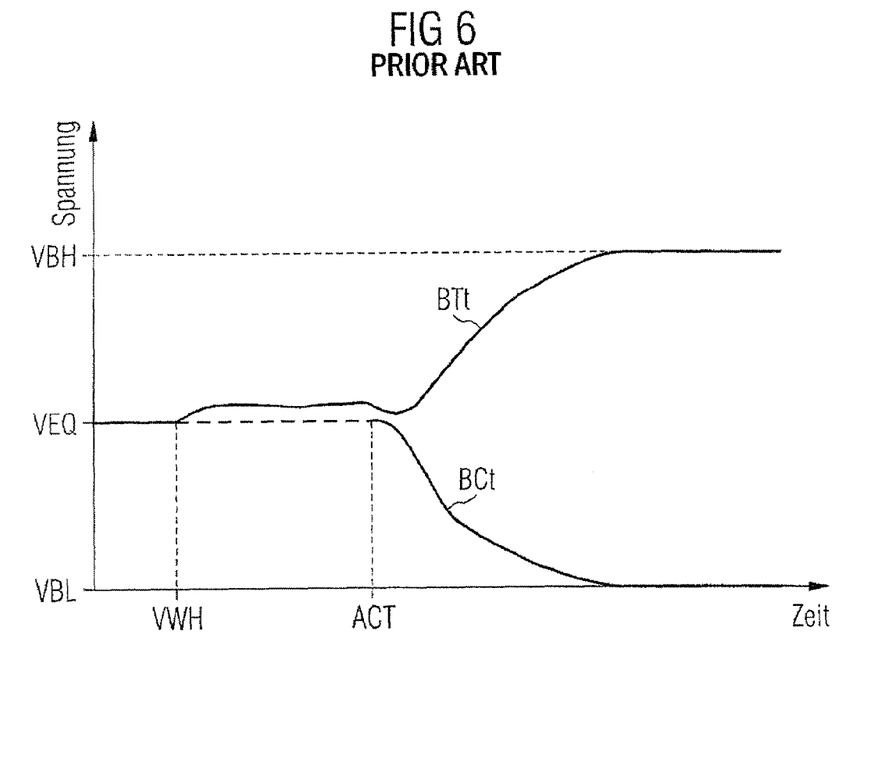
FIG. 6 shows potential states on a bit line pair during the read-out of a memory cell.

FIG. 6 shows potential states on the bit lines BTt and BCt for reading out a "1" information item from the memory cell SZ1. Due to the high charge level corresponding to the "1" information item on the storage capacitor SC, a potential increase occurs on the true bit line BTt relative to the precharge voltage VEQ to which the complement bit line BCt is charged. After a so-called signal development time, the sense amplifiers SA1 and SA3 on the right-hand side of the memory cell array and the sense amplifier SA2 on the left-hand side of the memory cell array are driven simultaneously by an activation signal ACT. The sense amplifiers thereupon evaluate the slight potential difference on the true bit line connected to them and the complement bit line connected to them. In the example of FIG. 6, the sense amplifier SA1 amplifiers the potential increase on the true bit line BTt to the high voltage level VBH and the voltage level of the precharge voltage VEQ on the complement bit line BCt to the low voltage level VBL.

In order to ensure the described proper operating behavior of an integrated semiconductor memory, the memories are subjected to comprehensive functional tests during and after fabrication. If a defective component is discovered within the memory cell array, an attempt is made to replace the defective component with a redundant component. Arranged in the memory cell array 10 is a redundant word line WLr, for example, to which redundant memory cells SZ1r, SZ2r, and SZ3r are connected. When a memory fault occurs in one of the regular memory cells SZ1, SZ2, or SZ3, instead of the faulty regular memory cell, one of the redundant memory cells is used for the read and write access to it by virtue of the redundant word line WLr being driven instead of the word line WL.

In order to cover as many fault causes as possible, different fault-specific data topologies are stored in the memory cells of the memory cell array. The memory states stored the memory cells are subsequently influenced by stress voltages. Thus, during a test, by way of example, the word line voltage on an adjacent word line is changed, the precharge voltage VEQ is varied or the plate voltage Vplate is changed. In order to cover as many fault causes as possible, many different data topologies have to be stored in the memory cell array, which leads to a long test time.

SUMMARY

The present invention provides an integrated semiconductor memory and method in which it is possible to perform a functional test by which many defective memory cells can be discovered as early as possible during fabrication.

According to one aspect of the invention, an integrated semiconductor memory comprises a memory cell array of memory cells, and first and second activatable sense amplifier arranged on different sides of the memory cell array. A first memory cell is connected to the first sense amplifier via a first bit line, and a second memory cell is connected to the second sense amplifier via a second bit line. Both the first and second memory cells are connected to a common word line. The first and second sense amplifiers can be activated temporally successively for a read access to the memory cell respectively connected to them.

In particular, during a functional test of the integrated semiconductor memory according to the invention, the first and second sense amplifiers are activated temporally successively for the read access. After the activation of the first sense amplifier, a voltage change occurs on the bit lines of the bit line pair which is connected to the first sensor amplifier, as a result of the so-called "post-sense coupling" effect. The voltage change is also transferred onto the bit lines of the adjacent bit line pair on account of parasitic coupling capacitances between adjacent bit line pairs. Consequently, a voltage shift also occurs on these bit lines. For a functional test of the integrated semiconductor memory, the second sense amplifier, which is connected to bit lines of the adjacent bit line pair, can be activated temporally after the activation of the first sense amplifier for a read access. This makes it possible, in particular during a functional test of the integrated semiconductor memory, to analyze voltage shifts which stem from "post-sense coupling" effects and are transferred onto adjacent bit line pairs via parasitic coupling capacitances. Such a functional test makes it possible to find a multiplicity of defective memory cells that would otherwise have to be determined by numerous different and time-consuming functional tests. Consequently, the test severity and test quality can be improved by an integrated semiconductor memory of this type.

The integrated semiconductor memory may also include a control circuit for activating the first and second sense amplifiers. The first sense amplifier has a control terminal for application of a first activation signal and the second sense amplifier has a control terminal for application of a second activation signal. The control circuit generates the first activation signal and the second activation signal on the output side.

In accordance with a further feature of the integrated semiconductor memory according to the invention, the control circuit comprises a first control terminal for application of a first control signal and a second control terminal for application of a second control signal. The control circuit is designed such that, when its first control terminal is driven with the first control signal, it generates the first activation signal for activating the first sense amplifier and supplies the first activation signal to the control terminal of the first sense amplifier. Furthermore, when the second control terminal is driven with the second control signal, the control signal generates the second activation signal for activating the second sense amplifier and supplies the second activation signal to the control terminal of the second sense amplifier.

In a further embodiment of the integrated semiconductor memory, the control circuit has a control terminal for application of a test mode control signal, and the integrated semiconductor memory further includes a first delay device for delaying the first activation signal and a second delay device for delaying the second activation signal. The first activation signal is supplied to the first delay device and the second activation signal is supplied to the second delay device from the control circuit. The first delay device delays the first activation signal by a time duration in a manner dependent on a state of the test mode control signal and supplies the first activation signal to the control terminal of the first activatable sense amplifier. The second delay device delays the second activation signal by a time duration in a manner dependent on the state of the test mode control signal and supplies the second activation signal to the control terminal of the second activatable sense amplifier.

The first delay device can have at least one first delay element and one second delay element, the first delay element of the first delay device delaying the first activation signal by a first time duration and the second delay element of the first delay device delaying the first activation signal by a second time duration. The second delay device likewise has at least one first delay element and one second delay element. The first delay element of the second delay device delays the second activation signal by a first time duration, and the second delay element of the second delay device delays the second activation signal by a second time duration.

Preferably, each of the first and second delay devices further comprises a controllable switch. The controllable switch of the first delay device supplies the first activation signal to the first or second delay element of the first delay device in a manner dependent on the state of the test mode control signal. Likewise, the controllable switch of the second delay device supplies the second activation signal to the first or second delay element of the second delay device in a manner dependent on the state of the test mode control signal.

In accordance with a further feature of the integrated semiconductor memory, the control circuit generates a first control signal for controlling the controllable switch of the first delay device and a second control signal for controlling the controllable switch of the second delay device. The first and second control signals generated by the control circuit are dependent on the state of the test mode control signal.

The integrated semiconductor memory can preferably be operated in a normal operating state and in a test operating state. In the normal operating state, the first and second activatable sense amplifiers are driven by the control circuit simultaneously with the first and second activation signals. In the test operating state, by contrast, the first and second sense amplifiers are driven temporally successively by the first and second activation signals.

In one preferred embodiment, in the normal operating state, the controllable switch of the first delay device is connected, on the output side, to the control terminal of the first activatable sense amplifier and the controllable switch of the second delay device is connected, on the output side, to the second activatable sense amplifier. In the test operating state, the controllable switch of the first delay device is connected to the control terminal of the first activatable sense amplifier via one of the first or second delay elements of the first delay device and the controllable switch of the second delay device is connected to the control terminal of the second activatable sense amplifier via one of the first or second delay elements of the second delay device.

In one embodiment, each of the delay elements of the first and second delay devices comprises inverter chains.

The first and second memory cells are preferably arranged adjacent along the common word line.

In accordance with another aspect of the present invention, a method for a functional test of the integrated semiconductor memory, such as that described above, involves writing a respective memory state to the first and second memory cells. The first and second memory cells are then activated by driving the common word line with a control voltage. A potential change is subsequently generated on the first and second bit lines due to activation of the first and second memory cells. The first activatable sense amplifier is then activated for performing a read access to the first memory cell. After a delay time has elapsed from the activation of the first activatable sense amplifier, the second activatable sense amplifier is activated for performing a read access to the second memory cell. Data generated in response to the read access to the second memory cell is subsequently read out from a data terminal. The second memory cell can be replaced by a redundant second memory cell if the data generated at the data terminal differs from the memory state previously written to the second memory cell.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to the figures showing exemplary embodiments of the present invention.

DETAILED DESCRIPTION

Figure 1:
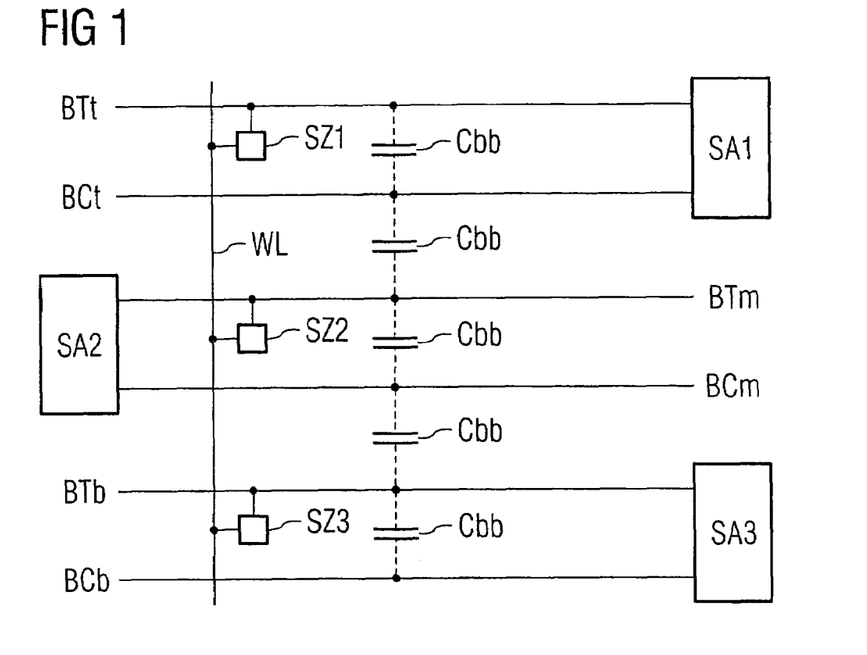
FIG. 1 shows a detail from a memory cell array with capacitive coupling of bit lines.

FIG. 1 shows a detail from the memory cell array 10 of FIG. 5 in an enlarged illustration. Parasitic coupling capacitances Cbb are present between the bit lines of a bit line pair. Parasitic coupling capacitances Cbb are likewise present between adjacent bit line pairs. In this case, the magnitude of the parasitic coupling capacitances is independent of whether the coupling capacitance is arranged between bit lines of a bit line pair or between adjacent bit line pairs. The reason for this is based on the fact that all the bit lines on a memory chip are generally produced in the same way, the same materials are used, the bit lines have the same dimensions, and the distances between the bit lines of a bit line pair and between different bit line pairs are identical.

The parasitic coupling capacitances influence the potential state on the bit lines of a bit line pair during a read access. In this case, it is necessary to make a distinction between coupling effects prior to the evaluation operation by the sense amplifier ("Pre-sense coupling") and coupling effects after the activation of a sense amplifier ("Post-sense coupling"). The coupling effects before and after the activation of a sense amplifier are described by Zaid Al-Ars et al. in the document "Influence of Bit Line Twisting on the Faulty Behavior of DRAMS" Records of the 2004 International Workshop on Memory Technology, Design and Testing (MTDT'04), 1087-4852/04, 2004 IEEE.

"Pre-sense coupling" effects occur after the word line voltage VWH for the activation of memory cells is fed onto the word line, but before the connected sense amplifiers are activated. A noise voltage occurs on the bit lines BTm and BCm, the noise voltage coming from the potential state of the bit line BCt and the potential state of the bit line BTb above and below the bit line pair BTm/BCm. In this case, the magnitude of the noise voltage depends on the memory states stored in the memory cells SZ1 and SZ3.

"Post-sense coupling" effects occur after the sense amplifiers are activated by the activation signal ACT and pull their connected bit lines to the high voltage potential VBH or the low voltage potential VBL. In this case, a further noise voltage arises on the bit lines of the connected sense amplifier, the cause of the further noise voltage residing in the time difference between the instant at which the sense amplifier is activated and the instant at which the sense amplifier amplifies the high or low voltage level after detecting the potential shift on the bit lines.

As a result of the noise voltage due to "Post-sense coupling" effects, a potential shift also occurs on the adjacent bit lines as a result of the parasitic capacitive coupling effects between adjacent bit line pairs. In this case, the potential shift is dependent on the memory state of the memory cells connected to the adjacent bit line pair.

Figure 2:
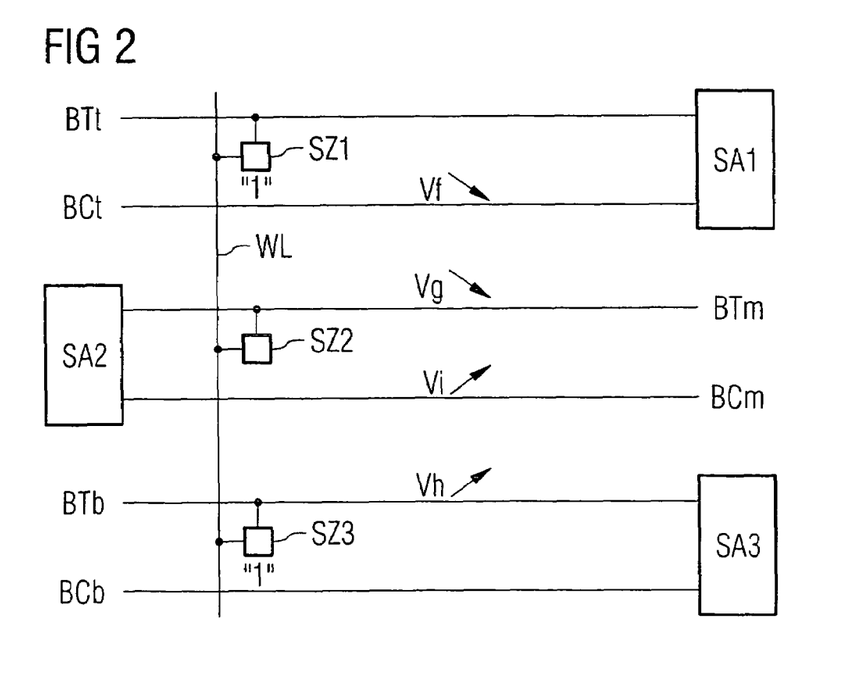
FIG. 2 shows a change of potential states on bit lines after the activation of sense amplifiers due to a capacitive coupling of bit lines.

FIG. 2 shows the influencing of potential states of adjacent bit lines during a read access to the memory cells along the word line WL if a "1" information item is in each case stored in the memory cell SZ1 connected to the bit line BTt and in the memory cell SZ3 connected to the bit line BTb. After the memory cells SZ1, SZ2, and SZ3 have been activated by the control voltage VWH on the word line WL, first the sense amplifiers SA1 and SA3 on the right-hand side of the memory cell array are activated. Due to the high voltage level on the bit line BTt, a potential decrease by a magnitude Vf occurs on the complement bit line BCt. As a result of the parasitic coupling to the true bit line BTm, the potential on the true bit line BTm is decreased by the magnitude Vg. A potential increase by the magnitude Vh occurs on the true bit line BTb after the activation of the sense amplifier SA3. Due to the parasitic coupling, the potential on the adjacent complement bit line BCm is also increased by the magnitude Vi.

The original potential change established directly after the activation of the memory cell SZ2 on the bit lines BTm and BCm is thus influenced by the noise voltages Vg and Vi. In the case of a defective memory cell SZ2, if for example the stored charge state was no longer high enough as a result of leakage effects upon activation of the memory cell, the original potential swing on the bit lines BTm and BCm is changed by the noise voltages in such a way that the memory state of the memory cell SZ2 is evaluated incorrectly after the activation of the sense amplifier SA2.

Figure 3:
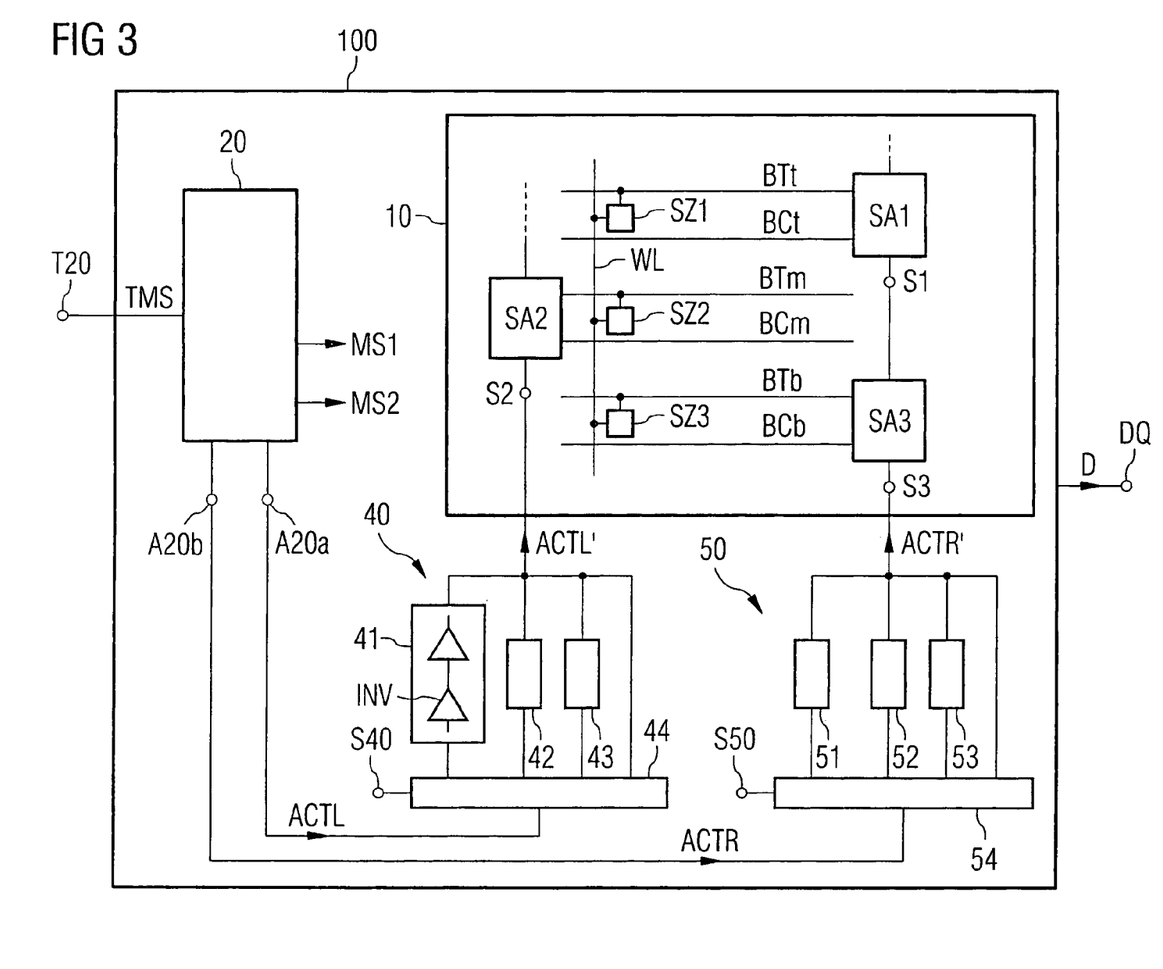
FIG. 3 shows a first embodiment of an integrated semiconductor memory for performing a functional test according to the invention.

The invention proposes simulating the influencing of a potential change on a bit line pair as a result of the activation of a connected memory cell by virtue of the parasitic coupling to adjacent bit lines. In this respect, FIG. 3 shows a first exemplary embodiment of an integrated semiconductor 100. The integrated semiconductor memory 100 comprises the memory cell array, already illustrated in FIG. 5, having the memory cell SZ1, SZ2, and SZ3 which are connected to the common word line WL. The memory state of the memory cell SZ1 is evaluated by evaluating the potential states on the bit lines BTt and BCt connected to the sense amplifier SA1. The memory state of the memory cell SZ2 is evaluated after evaluation of the potential states on the true bit line BTm and the complement bit line BCm by the sense amplifier SA2. The sense amplifier SA3 evaluates the potential states on the true bit line BTb and the complement bit line BCb during the read-out of the memory cell SZ3.

In contrast to FIG. 5, the sense amplifiers on the right-hand side of the memory cell array and the sense amplifiers on the left-hand side of the memory cell array are not driven by a common activation signal ACT, but rather by two different activation signals. The sense amplifiers SA1 and SA3 are driven by an activation signal ACTR' at their control terminals S1 and S3. The sense amplifier SA2 on the left-hand side of the memory cell array is driven by an activation signal ACTL' at its control terminal S2.

The activation signal ACTL' is generated by a delay device 40 after delaying an activation signal ACTL provided at an output terminal A20a of the control circuit 20. The delay device 40 comprises a controllable switch 44 having a control terminal S40. In a manner dependent on a control signal MS1 generated by the control circuit 20, the activation signal ACTL is fed to the control terminal S2 of the sense amplifier SA2 on the left-hand side of the memory cell array directly or else via a delay element 41, a delay element 42, or a delay element 43 as time-delayed activation signal ACTL'. The delay elements 41, 42 and 43 contain inverter chains INV of different lengths, by way of example. The delay elements have different delay times as a result. Consequently, after the driving of the controllable switch 44, the activation signal ACTL' occurs at the control terminal S2 of the sense amplifier SA2 after different times.

The activation signal ACTR' is generated by a delay device 50 from an activation signal ACTR provided at an output terminal A20b of the control circuit 20. The delay device 50 has the same structure as the delay device 40. It comprises a controllable switch 54 having a control terminal S50 for application of a control signal MS2 generated by the control circuit 20. In a manner dependent on the state of the control signal MS2, the activation signal ACTR for activating the sense amplifiers on the right-hand side of the memory cell array is fed to the control terminals S1 and S3 via a direct connection or else via one of the delay elements 51, 52, or 53. The delay elements have different signal propagation times. Consequently, the time-delayed activation signal ACTR' can be generated at different times after the driving of the delay device 50 with the activation signal ACTR.

The states of the control signals MS1 and MS2 are dependent on a bit sequence of a test mode control signal TMS, for example, which is fed externally to a control terminal T20 of the control circuit 20. Consequently, by means of the test mode control signal TMS, it is possible to select whether the activation signal ACTL for activating the sense amplifiers on the left-hand side of the memory cell array is fed to the sense amplifiers on the left-hand side of the memory cell array via the direct connection, i.e., without a delay, or via one of the delay elements 41, 42, or 43. It is likewise possible to select, by means of the state of the test mode control signal, whether the activation signal ACTR is fed to the sense amplifiers on the right-hand side of the memory cell array via the direct connection, i.e., without a delay, or else via one of the delay elements 51, 52, or 53.

Figure 4:
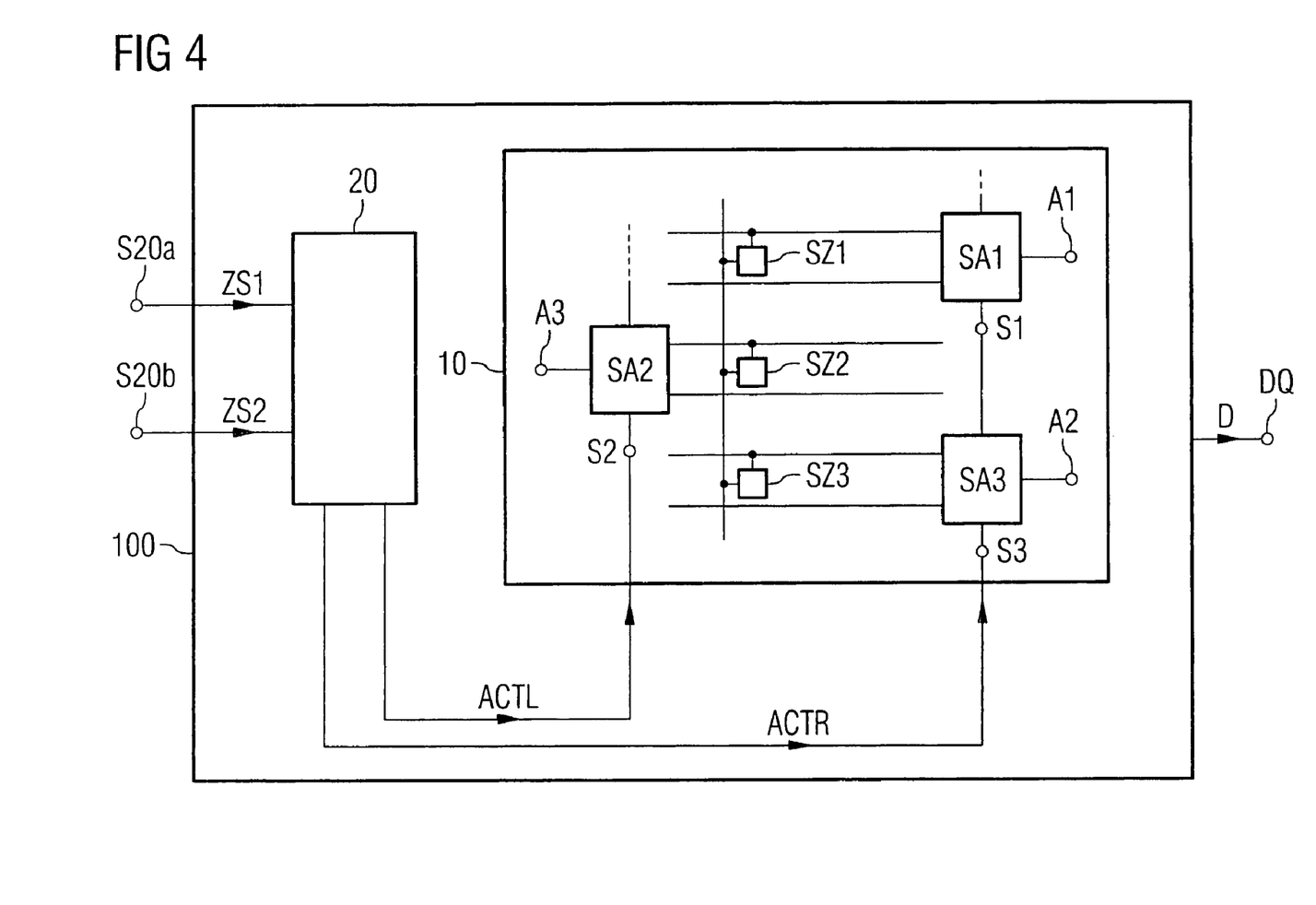
FIG. 4 shows a second embodiment of an integrated semiconductor memory for performing a functional test according to the invention.

FIG. 4 shows a further embodiment of the integrated semiconductor memory for performing a functional test by which it is possible to simulate the influencing of the potential state of a bit line resulting from coupling influences of adjacent bit lines. In contrast to FIG. 3, the activation signals ACTL for activating the sense amplifiers on the left-hand side of the memory cell array and the activation signal ACTR for activating the sense amplifiers on the right-hand side of the memory cell array are fed directly to the respective sense amplifiers from a control circuit 20. The control circuit 20 has a control terminal S20a for application of a control signal ZS1 and a control terminal S20b for application of a control signal ZS2.

The activation signal ACTL can be controlled temporally by the control signals ZS1. The activation signal ACTR can be controlled temporally by the control signal ZS2. A change in the state of the control signal ZS1 from a low level to a high level has the effect, for example, that the control circuit 20 drives the sense amplifier SA2 with the activation signal ACTL. A change in the state of the control signals ZS2 from a low level to a high level has the effect that the control circuit 20 drives the sense amplifiers SA1 and SA3 with the activation signal ACTR. The delay time with which the sense amplifiers SA1 and SA3 are activated in contrast to the activation of the sense amplifier SA2 can thus be established externally by application of the control signals ZS1 and ZS2 with a temporal delay.

The embodiment of the integrated semiconductor memory in accordance with FIGS. 3 and 4 enables the sense amplifiers on the left-hand and right-hand sides of the memory cell array to be activated simultaneously or else in a temporally delayed fashion. In particular, for performing a functional test for simulating coupling influences between adjacent bit lines, the sense amplifiers on the left-hand and right-hand sides of the memory cell array are activated in a temporally delayed fashion. Since coupling influences between adjacent bit lines can be simulated by the integrated semiconductor memory according to the invention, it is possible to improve the test severity in the wafer level test and thus to increase the test quality. By varying the delay times between the activation of the sense amplifiers on the left-hand and right-hand sides of the memory cell array, it becomes possible, during an early test stage, to select defective memory cells and to replace them by redundant memory cells, so that further tests required hitherto can be obviated. The test time can thereby be reduced.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 10 memory cell array
20 control circuit
30 address register
40, 50 delay device
31, 32, 33 delay elements
34 controllable switch
41, 42, 43 delay elements
44 controllable switch
ACT activation signal
ACTL, ACTR activation signals
AT selection transistor
BC complement bitline
BT true bitline
Cbb parasitic coupling capacitance
D datum
DQ data terminal
KS command signal
MS control signals
SA sense amplifier
SC storage capacitor
SZ memory cell
SZr redundant memory cell
T control terminal
TMS test mode control signal
VBH high voltage level
VBL low voltage level
VEQ precharge voltage
Vf, Vg, Vi, Vh noise voltages
VWH control voltage
WL word line
WLr redundant word line
ZS external activation signal

What is claimed is:

1. An integrated semiconductor memory, comprising:
a memory cell array comprising a plurality of memory cells, including first and second memory cells;
a common word line coupled to the first and second memory cells;
a first activatable sense amplifier and a second activatable sense amplifier arranged on different sides of the memory cell array, the first memory cell being coupled to the first sense amplifier via a first bit line and the second memory cell being coupled to the second sense amplifier via a second bit line;
wherein a timing of activation of the first sense amplifier for a read access of the first memory cell is separately controllable from a timing of activation of the second sense amplifier for a read access of the second memory cell by respective first and second activation signals, such that the first and second sense amplifiers are activatable temporally successively for respective read accesses of the first and second memory cells;
a first delay device configured to receive the first activation signal, the first delay device generating a delayed first activation signal by delaying transmission of the first activation signal to the first sense amplifier;
a second delay device configured to receive the second activation signal, the second delay device generating a delayed second activation signal by delaying transmission of the second activation signal to the second sense amplifier;
the first delay device including at least first and second delay elements, the first delay element of the first delay device generating the delayed first activation signal by delaying the first activation signal by a first time duration, and the second delay element of the first delay device generating the delayed first activation signal by delaying the first activation signal by a second time duration, the second time duration being different from the first time duration; and
the second delay device including at least first and second delay elements, the first delay element of the second delay device generating the delayed second activation signal by delaying the second activation signal by a first time duration, and the second delay element of the second delay device generating the delayed second activation signal by delaying the second activation signal by a second time duration, the second time duration being different from the first time duration.

2. The integrated semiconductor memory of claim 1, further comprising a control circuit configured to activate the first sense amplifier with said first activation signal and to activate the second sense amplifier with said second activation signal.

3. The integrated semiconductor memory of claim 2, wherein the control circuit generates the first activation signal in response to receipt of a first control signal and generates the second activation signal in response to receipt of a second control signal.

4. The integrated semiconductor memory of claim 2, wherein:
the first delay device delays transmission of the first activation signal to the first sense amplifier by a time duration that is a function of a state of a first control signal from the control circuit; and
the second delay device delays transmission of the second activation signal to the second sense amplifier by a time duration that is a function of a state of a second control signal from the control circuit.

5. The integrated semiconductor memory of claim 4, wherein:
the first delay device comprises a controllable switch that supplies the first activation signal to the first or second delay element of the first delay device based on a state of the first control signal; and
the second delay device comprises a controllable switch that supplies the second activation signal to the first or second delay element of the second delay device based on a state of the second control signal.

6. The integrated semiconductor memory of claim 5, wherein states of the first and second control signals are dependent upon a test mode control signal received by the control circuit.

7. The integrated semiconductor memory of claim 5, wherein, in a normal operating state of the integrated semiconductor memory, the controllable switches of the first and second delay device are respectively coupled to the first and second sense amplifiers without intervening delay elements.

8. The integrated semiconductor memory of claim 1, wherein the first and second delay elements of the first and second delay devices comprise inverter chains.

9. The integrated semiconductor memory of claim 2, wherein the integrated semiconductor memory is operable in a normal operating state in which the first and second activatable sense amplifiers are driven by the control circuit simultaneously with the first and second activation signals, and is operable in a test operating state in which the first and second sense amplifiers are driven temporally successively by the first and second activation signals.

10. The integrated semiconductor memory of claim 1, wherein the first and second memory cells are arranged adjacent along the common word line.

11. A method for testing an integrated semiconductor memory comprising a memory cell array including at least a first memory cell coupled to a first sense amplifier via a first bit line and a second memory cell coupled to a second sense amplifier via a second bit line, the first and second sense amplifiers being arranged on two different sides of the memory cell array, the first and second memory cells being coupled to a common word line for activation of a read or write access, the method comprising:

writing respective memory states to the first and second memory cells;

activating the first and second memory cells by driving the common word line with a control voltage;

generating a potential change on the first and second bit lines in response to activation of the first and second memory cells;

activating the first sense amplifier to perform a read access to the first memory cell;

selecting a delay time of a first and second delay time in dependence on a control signal externally fed to the integrated semiconductor memory, the first delay time being different from the second delay time;

activating the second sense amplifier to perform a read access to the second memory cell after the selected delay time has elapsed from activation of the first sense amplifier; and reading out data generated at a data terminal resulting from the read access to the second memory cell.

12. The method of claim 11, further comprising:

replacing the second memory cell with a redundant second memory cell in response to the data generated at the data terminal differing from the memory state previously written to the second memory cell.

* * * * *